(12) United States Patent
Kang et al.

(10) Patent No.: US 8,933,747 B2
(45) Date of Patent: Jan. 13, 2015

(54) SEMICONDUCTOR CHIP PACKAGE INCLUDING VOLTAGE GENERATION CIRCUIT WITH REDUCED POWER NOISE

(75) Inventors: SunWon Kang, Seongnam-si (KR); Chiwook Kim, Hwaseong-si (KR); Hyun jeong Woo, Hwaseong-si (KR); Sangjoon Hwang, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 140 days.

(21) Appl. No.: 13/617,802

(22) Filed: Sep. 14, 2012

(65) Prior Publication Data

US 2013/0088289 A1    Apr. 11, 2013

(30) Foreign Application Priority Data

Oct. 10, 2011    (KR) .................. 10-2011-0103018

(51) Int. Cl.
| | | |
|---|---|---|
| *G11C 5/14* | (2006.01) | |
| *G05F 3/00* | (2006.01) | |
| *H02M 1/14* | (2006.01) | |
| *H01L 23/64* | (2006.01) | |
| *G11C 11/4074* | (2006.01) | |

(52) U.S. Cl.
CPC .......... *H01L 23/642* (2013.01); *G11C 11/4074* (2013.01); *H01L 2924/0002* (2013.01)
USPC ............................ 327/565; 327/538; 365/226

(58) Field of Classification Search
None
See application file for complete search history.

(56) References Cited

U.S. PATENT DOCUMENTS

| | | | |
|---|---|---|---|
| 7,110,316 B2 | 9/2006 | Choi et al. | |
| 7,221,206 B2 * | 5/2007 | Misawa et al. | 327/291 |
| 7,489,035 B2 | 2/2009 | Song et al. | |
| 7,573,322 B2 * | 8/2009 | Gatta et al. | 327/538 |
| 8,330,532 B2 * | 12/2012 | Nikolov et al. | 327/540 |

FOREIGN PATENT DOCUMENTS

| | | | | |
|---|---|---|---|---|
| JP | 2008-028281 | | 2/2008 | |
| KR | 1020010005095 | | 1/2001 | |
| KR | 10-0349682 | * | 7/2002 | ............... G11C 5/14 |
| KR | 10-0611506 | * | 12/2005 | ............... G11C 7/02 |

\* cited by examiner

*Primary Examiner* — Lincoln Donovan
*Assistant Examiner* — Terry L Englund
(74) *Attorney, Agent, or Firm* — Ellsworth IP Group PLLC

(57) ABSTRACT

A semiconductor chip package eliminates and minimizes a power noise generated from a voltage generation circuit in the semiconductor chip package includes an integrated circuit chip with a voltage generation circuit that receives an external voltage to generate a supply voltage to be used in an internal circuit and a connection terminal connected to an output node of the voltage generation circuit, and a mounting substrate including a noise eliminator electrically connected to the connection terminal to reduce a power noise of the supply voltage and a mounting substrate to mount the integrated circuit chip to package the integrated circuit chip as the semiconductor chip package.

18 Claims, 8 Drawing Sheets

SEMICONDUCTOR CHIP PACKAGE INCLUDING VOLTAGE GENERATION CIRCUIT WITH REDUCED POWER NOISE

CROSS-REFERENCE TO RELATED APPLICATIONS

This U.S. non-provisional patent application claims priority under 35 U.S.C. §119 of Korean Patent Application No. 10-2011-0103018, filed on Oct. 10, 2011, the entire contents of which are hereby incorporated by reference.

BACKGROUND

1. Field

The present general inventive concept herein relates to an apparatus to remove power noise in an integrated circuit chip, and more particularly, to a semiconductor chip package to reduce power noise in a circuit which receives an external supply voltage to provide a supply voltage for an internal circuit.

2. Description of the Related Art

An integrated circuit chip including a semiconductor memory such as a dynamic random access memory (hereinafter DRAM) operates by receiving a power supply from an outside power source thereof after being packaged. A level of an external voltage applied through an external voltage supply terminal may be changed by an external environment or a power noise generated when an integrated circuit chip operates. However, it is difficult to change a level of external voltage freely when necessary.

An integrated circuit chip may include a voltage generation circuit such as an internal voltage converter (IVC) to convert an external voltage into a power supply voltage for the inside of the integrated circuit chip.

An IVC may make voltages appropriate for a semiconductor device. The IVC may be able to maintain an internal voltage by a negative feedback even when an external voltage is changed. If using the IVC, operation parameters of semiconductor device may be controlled.

A voltage generation circuit, such as the IVC, may cope with a product having various power supply voltages and may reduce power consumption. However, the IVC is weak to power noise caused by a speed up of an internal circuit connected to a voltage generation circuit.

SUMMARY

The present general inventive concept provides a semiconductor chip package to reduce power noise in a circuit when it receives a supply voltage from an external source to provide voltage for an internal circuit. Embodiments of the present general inventive concept provide a semiconductor chip package including: an integrated circuit chip that includes a voltage generation circuit that receives an external voltage to generate a supply voltage to be used in an internal circuit and a connection terminal connected to an output node of the voltage generation circuit; and a mounting substrate that includes a noise eliminator electrically connected to the connection terminal to reduce power noise of the supply voltage and mount the integrated circuit chip to package the integrated circuit chip as the semiconductor chip package.

Additional features and utilities of the present general inventive concept will be set forth in part in the description which follows, and in part, will be obvious from the description, or may be learned by practice of the general inventive concept.

The foregoing and/or other features and utilities of the inventive concept can substantially be achieved by providing a semiconductor chip package including: an integrated circuit chip including an external voltage supply circuit that receives an external voltage to distribute: a voltage generation circuit that receives the external voltage distributed by the external voltage supply circuit to generate a supply voltage to be used in an internal circuit: a first connection terminal connected to an input node of the external voltage supply circuit and a second connection terminal connected to an output terminal of the supply voltage of the voltage generation circuit; and a mounting substrate including a first and a second noise eliminator independently connected to the first and second terminals to reduce a power noise of the external voltage and the supply voltage and to mount the integrated circuit chip to package the integrated circuit chip as the semiconductor chip package.

The foregoing and/or other features and utilities of the inventive concept can substantially be achieved by providing by an electronic apparatus including an interface unit to receive an external voltage from an external supply source, a semiconductor chip package that may include an integrated circuit chip including a voltage generation circuit that receives the external voltage from the external supply source to generate a supply voltage to be used in an internal circuit and a connection terminal connected to an output node of the voltage generation circuit, and a mounting substrate including a noise eliminator electrically connected to the connection terminal to reduce a power noise of the supply voltage and to mount the integrated circuit chip to package the integrated circuit chip as the semiconductor package, and a control unit to control the semiconductor chip package to process a function of the electronic apparatus to be associated with data of the semiconductor chip package.

The noise eliminator may be formed outside of the integrated circuit chip and may reduce a power noise of the external voltage supplied from the external supply source.

The control unit may control an input unit to transmit a user command, and the interface to receive an audio and video image data from an external device.

The noise eliminator may allow the input unit to input the user command with a reduced level of distortion and interference and the interface unit to receive the audio and video image data with a reduced level of distortion and interference from the external device.

The electronic apparatus may further include a functional unit to process the input command and the audio and video image data and the control unit can control a display unit to display the audio and video image data with the reduced level of distortion and interference.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
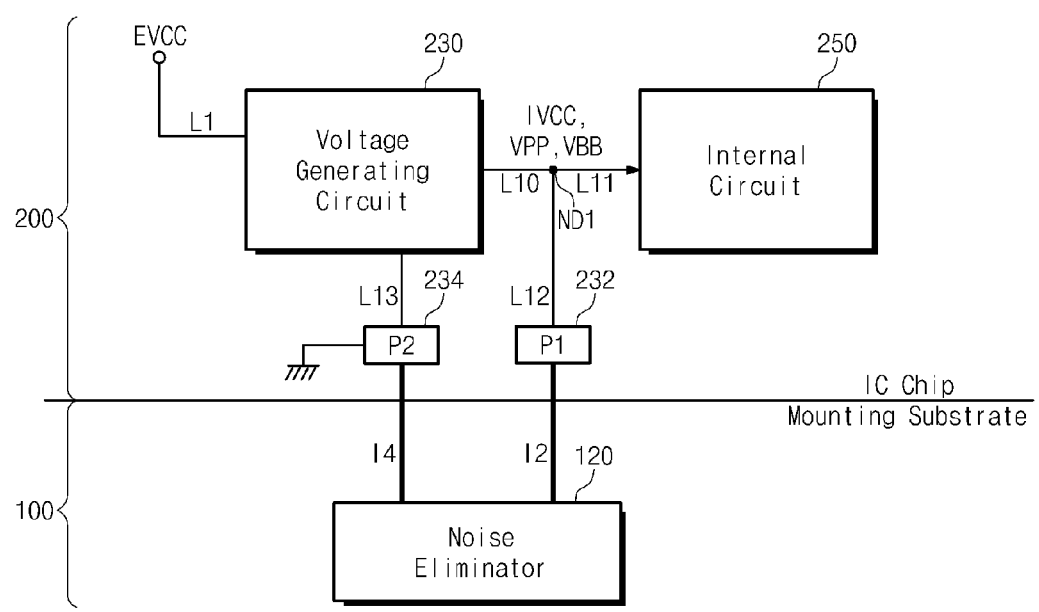
FIG. 1 is a circuit connection diagram of a semiconductor chip package of an embodiment of the present general inventive concept.

Embodiments of present general inventive concept will be described more fully hereinafter with reference to the accompanying drawings, in which embodiments of the invention are shown. This present general inventive concept may, however, be embodied in many different forms and should not be construed as limited to the embodiments set forth herein. Rather, these embodiments are provided so that this disclosure will be thorough and complete, and will fully convey the scope of the present general inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present.

FIG. 1 is a circuit connection diagram of a semiconductor chip package according to an embodiment of the present general inventive concept. Referring to FIG. 1, the semiconductor chip package includes an integrated circuit chip 200 and a mounting substrate 100.

The integrated circuit chip 200 includes a voltage generation circuit 230 which receives an external voltage to generate a supply voltage to be used in an internal circuit 250 and a connection terminal 232 connected to an output node ND1 of the supply voltage of the voltage generation circuit 230.

The mounting substrate 100 includes a noise eliminator 120 electrically connected to the connection terminal 232 to reduce a power noise of the supply voltage and also mounts the integrated circuit chip 200 to package the integrated circuit chip 200 as the semiconductor chip package.

In the case that the integrated circuit chip 200 is a semiconductor memory device such as a DRAM, the integrated circuit chip 200 may include a memory cell array, a core circuit, and a peripheral circuit.

The voltage generation circuit 230 is an internal voltage converter (IVC) to generate an internal voltage for a peripheral circuit or a memory cell array. The voltage generation circuit 230 may be a high voltage generation circuit generating a high voltage VPP greater than the external voltage or may be a back bias voltage generation circuit to generate a back bias voltage.

The noise eliminator 120 may be a decoupling capacitor as a decoupling device to eliminate the power noise.

The decoupling device may be formed on an upper portion, an inside, a lower portion, or a side portion of the mounting substrate 100. The decoupling device may have a portion exposed outside of the mounting substrate 100. The decoupling device may not be seen from outside of the mounting substrate 100.

The decoupling capacitor may be connected to the connection terminal 232 through a wire bonding or a flip chip bonding.

The decoupling capacitor may be mounted on the mounting substrate 100 by using an embedded mounting method. The decoupling device may be a film type capacitor or a silicon capacitor.

As illustrated in FIG. 1, if the voltage generation circuit 230 receives an external voltage (EVCC) through a line L1 and then outputs a supply voltage (e.g., IVCC) to be used in the internal circuit 250 through an output line L10, the internal circuit 250 then receives an internal voltage (IVCC) through a line L11 connected to the output node ND1. If a load is changed by an operation of the voltage generation circuit 230 or a high speed operation of the internal circuit 250, a power noise is generated and the output node ND1 is affected by the generated power noise.

The power noise is generated at the connection terminal 232 by a pad connected to the output node ND1 through a line L12. In an embodiment of the inventive concept, the power noise of the voltage generation circuit 230 is eliminated or minimized by electrically connecting the connection terminal 232 to the noise eliminator 120 through an interconnection line I2. A connection terminal 234 connected to the voltage generation circuit 230 through a line L13 may function as a ground pad and may be connected to the noise eliminator 120 through a ground interconnection line I4.

The noise eliminator 120 is formed on the mounting substrate 100 located at the outside of the integrated circuit chip 200. Therefore, since the noise eliminator 120 may be formed to have a relatively greater capacity than a noise eliminator located inside the integrated circuit chip 200, removing power noise may be superior as a result. A decoupling capacitor as a noise eliminator may be installed on a system substrate, a mounting substrate of semiconductor package, or inside the integrated circuit chip. If the decoupling capacitor is located inside the integrated circuit chip, the efficiency is relatively good, but the capacity of a capacitor is comparatively low due to the limited area of the integrated circuit chip. Thus, a method of forming a decoupling capacitor on a mounting substrate 100 of the chip package is used.

In this method, the power noise generated in the voltage generation circuit 230 in the integrated circuit chip is efficiently eliminated or minimized by the noise eliminator 120. In the event that the scheme of FIG. 1 is applied to an internal voltage converter (IVC) of a semiconductor memory device such as a DRAM, a fluctuation of a power supply and a ground of the voltage generation circuit 230 is suppressed, so that the internal circuit 250 may receive a more reliable internal voltage from which a power noise is eliminated. Thus, an immunity of a semiconductor memory device such as a DRAM to power noise is improved and thereby reliability of data access operation may be improved as well.

Figure 2:
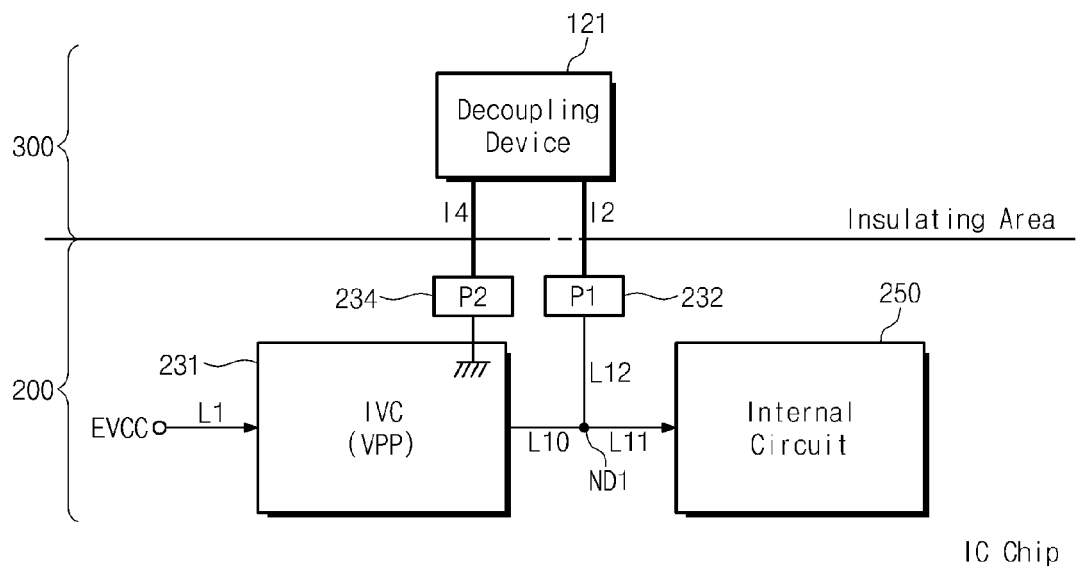
FIG. 2 is a circuit connection diagram of FIG. 1.

FIG. 2 is a circuit connection diagram of a modified embodiment of FIG. 1.

Referring to FIG. 2, a decoupling device 121 corresponding to the noise eliminator 120 of FIG. 1 is formed in an insulating area 300. The insulating area may be an area formed in an upper portion of the integrated circuit chip 200. The insulating area 300 may also be an area formed on the mounting substrate 100 of FIG. 1.

If an IVC 231 receives an external voltage EVCC through the line L1 to output a supply voltage IVCC to be used in the internal circuit 250 through the output line L10, the internal circuit 250 receives an internal voltage through the line connected to the output node ND1. If a power noise is generated by the IVC 231 or the internal circuit 250, the output node ND1 is affected by the generated power noise.

Similar to the embodiment illustrated in FIG. 1, the power noise is generated in a connection terminal 232 such as a pad connected to the output node ND1 through the line L12. In some embodiments of the inventive concept, the power noise of the IVC 231 is eliminated or minimized by electrically connecting the connection terminal 232 to the decoupling device 121 through an interconnection line I2. A connection terminal 234 connected to the IVC 231 may function as a ground pad and may be connected to the decoupling device 121 through a ground interconnection line I4.

In a structure of semiconductor chip package of FIG. 2, a power noise generated in the IVC 231 or a high voltage generator of the integrated circuit chip may be effectively eliminated or minimized by the decoupling device 121 formed in the insulating area 300.

Figure 3:
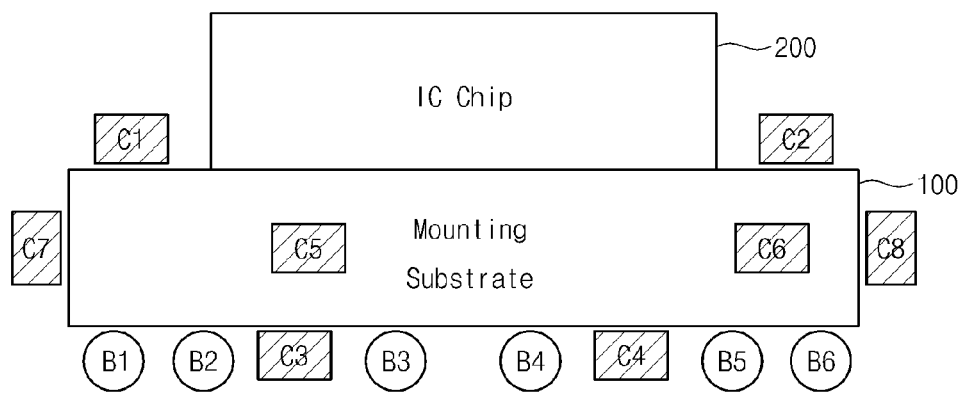
FIG. 3 is a drawing illustrating a cross sectional structure of the semiconductor chip package of FIG. 1.

FIG. 3 is a drawing illustrating a cross sectional structure of the semiconductor chip package of FIG. 1.

Referring to FIG. 3, an integrated circuit chip 200 is formed on an upper portion of the mounting substrate 100. Decoupling devices C1 and C2 that can be used to eliminate a power noise are formed on an upper portion of the mounting substrate 100 and may be connected to the voltage generation circuit 230 in the integrated circuit chip 200.

Decoupling devices C3 and C4 that can be used to eliminate a power noise are formed on a lower portion of the mounting substrate 100 and may be connected to the voltage generation circuit 230 in the integrated circuit chip 200.

Decoupling devices C5 and C6 that can be utilized to eliminate a power noise are formed inside of the mounting substrate 100 and may be connected to the voltage generation circuit 230 in the integrated circuit chip 200.

Decoupling devices C7 and C8 that can be utilized to eliminate a power noise are formed on a side portion of the mounting substrate 100 and may be connected to the voltage generation circuit 230 in the integrated circuit chip 200.

The semiconductor chip package may have contact bumps B1-B6 formed on the mounting substrate 100 to electrically contact an external device such as a controller or a microprocessor.

In FIG. 3, a power noise generated from the inside of the integrated circuit chip 200 may be effectively eliminated or minimized by at least one of the decoupling devices C1-C8.

Figure 4:
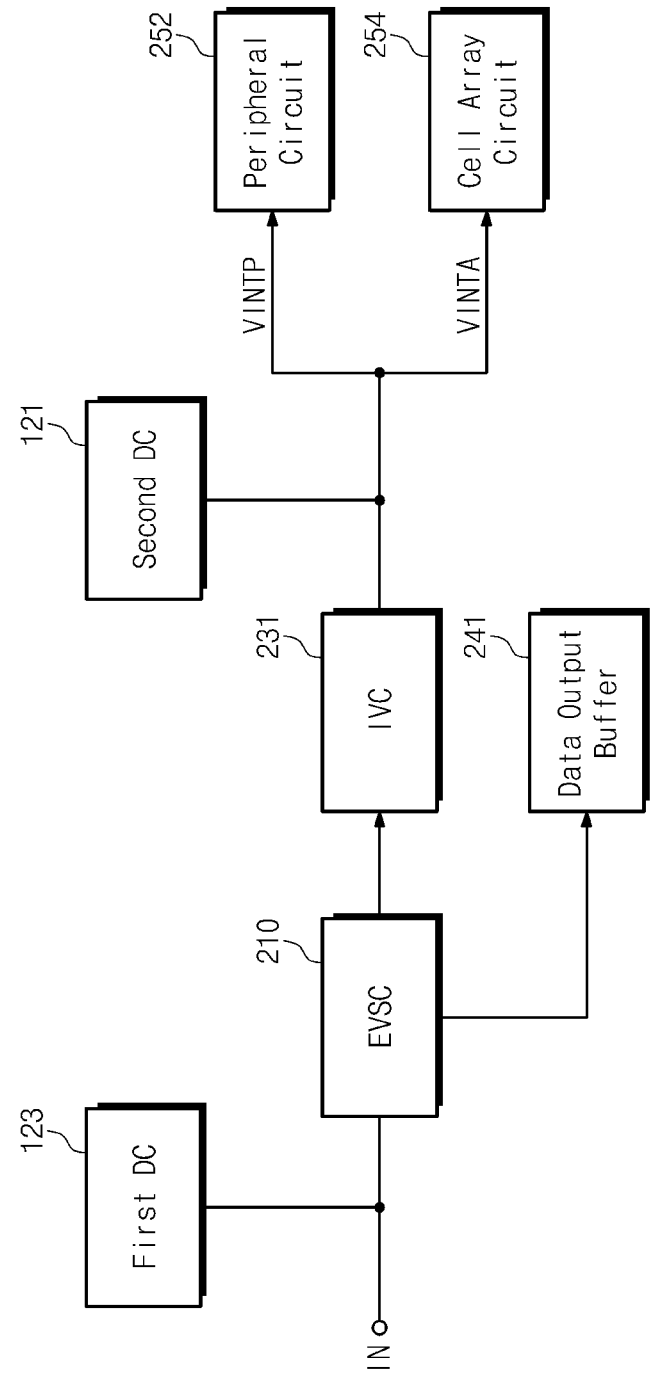
FIG. 4 is a functional circuit diagram illustrating the semiconductor chip package of FIG. 3.

FIG. 4 is a functional circuit diagram of the semiconductor chip package of FIG. 3.

Referring to FIG. 4, a first decoupling capacitor 123 and a second decoupling capacitor 121 are noise eliminators that are formed on the mounting substrate 100. An external voltage supply voltage (EVSC) 210, an internal voltage converter (IVC) 231, a data output buffer 241, a peripheral circuit 252, and a cell array circuit 254 are formed in the integrated circuit chip 200.

The external voltage supply circuit (EVSC) 210 receives and distributes an external voltage EVCC.

The IVC 231 receives the external voltage EVCC through the external voltage supply circuit (EVSC) 210 to generate a supply voltage to be used in the internal circuit 250.

The peripheral circuit 252 and the cell array circuit 254 are included in the internal circuit 250. The peripheral circuit 252 receives a peripheral internal voltage VINTP from the IVC 231. The cell array circuit 254 receives an array internal voltage VINTA from the IVC 231.

The data output buffer 241 outputs data stored in memory cells and may receive the external voltage EVCC through the external voltage supply circuit (EVSC) 210.

A power noise generated from the external voltage supply circuit 210 is eliminated or minimized by the first decoupling capacitor 123. Also, a power noise from the IVC 231 is eliminated or minimized by the second capacitor 121.

Figure 5:
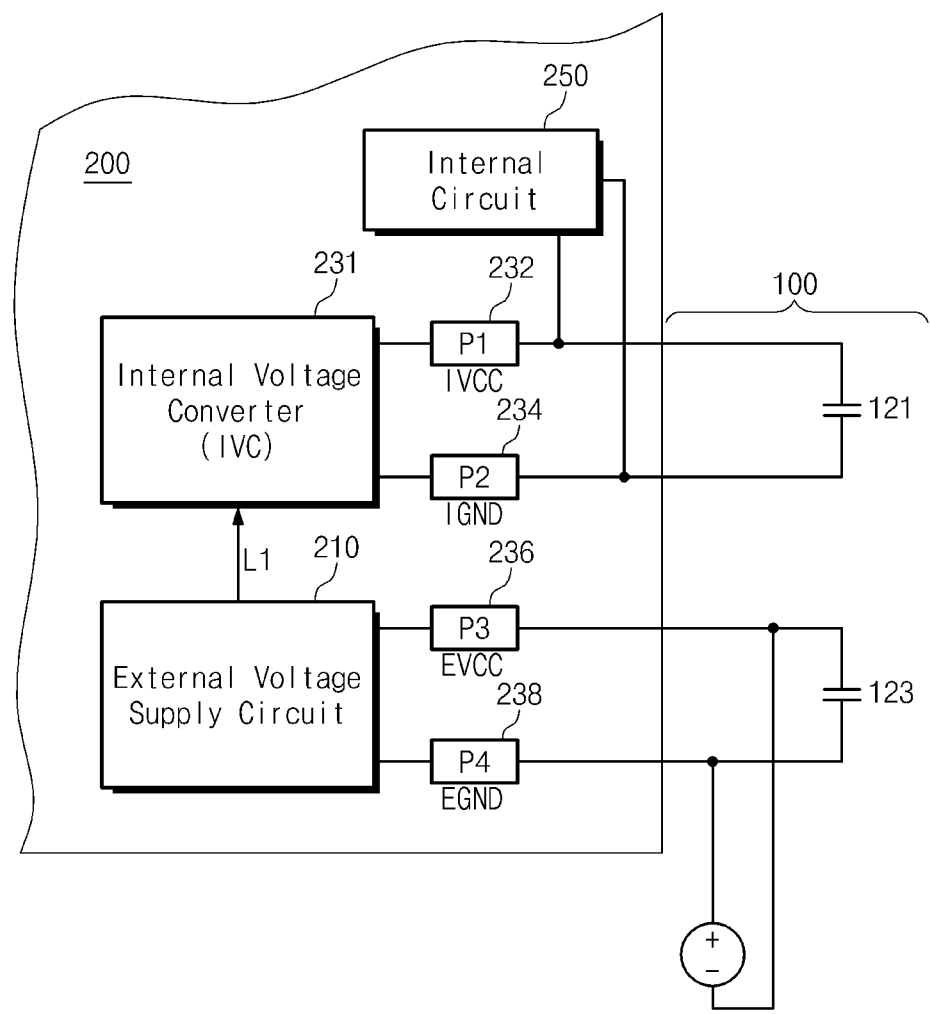
FIG. 5 is a circuit illustration an electrical connection between decoupling capacitors and circuits of the integrated circuit chip in the semiconductor chip package of FIG. 3.

FIG. 5 is a circuit illustration of an electrical connection between decoupling capacitors and circuits of the integrated circuit chip in the semiconductor chip package of FIG. 3.

Referring to FIG. 5, the external voltage supply circuit 210 receives an external voltage EVCC from an external power supply. Thus, an external voltage EVCC is applied between pads (P3) 236 and (P4) 238 that are connected to an input terminal of the external voltage supply circuit 210.

The internal voltage converter (IVC) 231 receives the external voltage EVCC from the external voltage supply circuit 210 through a line L1 to generate a supply voltage to be used in the internal circuit 250. An internal voltage IVCC is applied between pads (P1) 232 and (P2) 234 that are connected to an output terminal of the internal voltage converter 231. The internal voltage IVCC may be the peripheral internal voltage VINTP or the array internal voltage VINTA.

A power noise generated from the external voltage supply circuit 210 may be eliminated or minimized by the first decoupling capacitor 123 formed on the mounting substrate 100 and electrically connected to pads 236 and 238.

A power noise generated from the internal voltage converter 231 may be eliminated or minimized by the second decoupling capacitor 121 formed on the mounting substrate 100 and electrically connected to pads 232 and 234.

Since the first and second decoupling capacitors 123 and 121 are not formed inside the integrated circuit chip 200 but directly on the mounting substrate 100, performance of noise removal is superior as a result.

Figure 6:
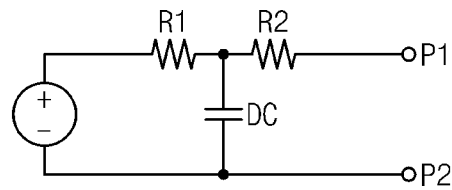
FIG. 6 is an equivalent circuit connection diagram of FIG. 5.

FIG. 6 is an equivalent circuit connection diagram of FIG. 5.

In FIG. 6, a decoupling capacitor DC connected between load terminals P1 and P2 corresponds to the second decoupling capacitor 121 in FIG. 5. Resistors R1 and R2 that are connected between an external power supply and the load terminal P1 may be parasitic resistors or resistors that may be inserted when necessary. An RC filter formed in a structure like FIG. 6 eliminates power noise.

Figure 7:
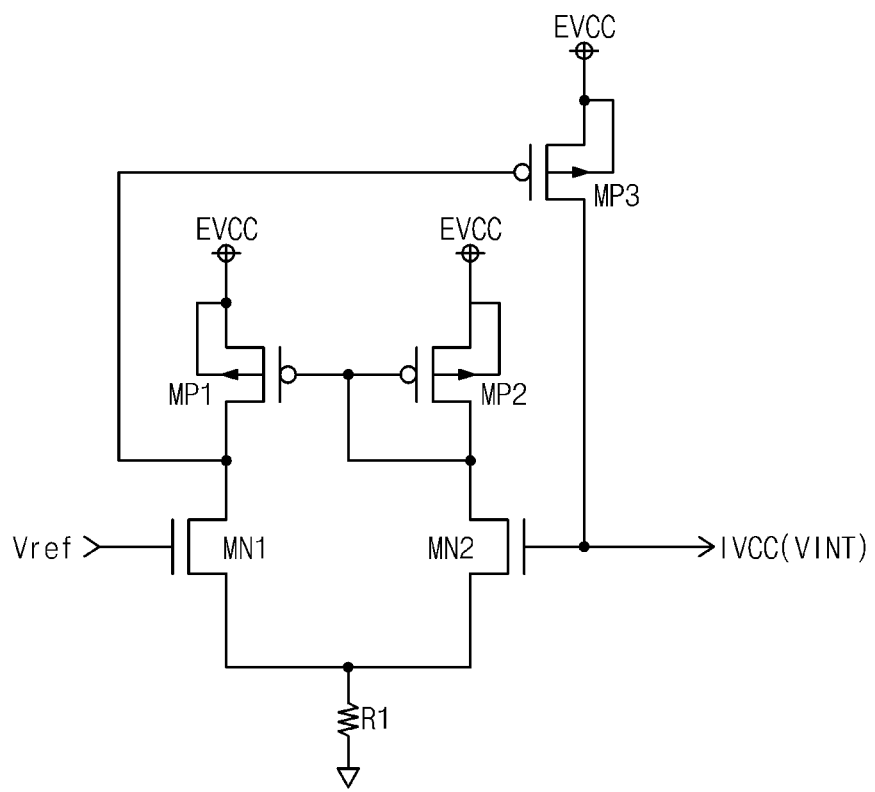
FIG. 7 is a detailed circuit of the IVC illustrated in FIG. 5.

FIG. 7 is a detailed circuit of the IVC illustrated in FIG. 5.

Referring to FIG. 7, the IVC 231 may be formed in a current mirror type is illustrated. The IVC 231 may also be embodied by p-type MOS transistors MP1, MP2 and MP3, n-type MOS transistors MN1 and MN2, and a resistor R1.

In FIG. 7, if a reference voltage Vref is applied to a gate of the n-type MOS transistor MN1 and an external voltage EVCC is applied to sources of the p-type MOS transistors MP1, MP2 and MP3, an internal voltage IVCC is generated at a drain of the p-type MOS transistor MP3. The waveform of the internal voltage IVCC is shown by a graph illustrated in FIG. 8. A level of the internal voltage IVCC may be equal to or less than the external voltage EVCC. The IVC of FIG. 7 is only an example of various different types of internal voltage converters that may be used in embodiments of the inventive concept.

Figure 8:
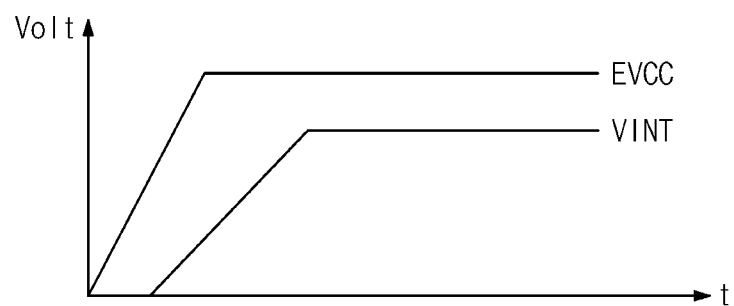
FIG. 8 is a graph showing waveforms of voltages of FIG. 7.

FIG. 8 is a graph showing waveforms of the external voltage EVCC and the internal voltage VINT of the IVC circuit illustrated in FIG. 7.

In the graph, a horizontal axis represents a time and a vertical axis represents a voltage. A power noise of the internal voltage VINT generated from the IVC 231 is eliminated or minimized by the decoupling capacitor 121 formed on the mounting substrate 100. Thus, the internal voltage VINT generated from the IVC 231 is supplied to the internal circuit 250 in a stable condition.

Figure 9:
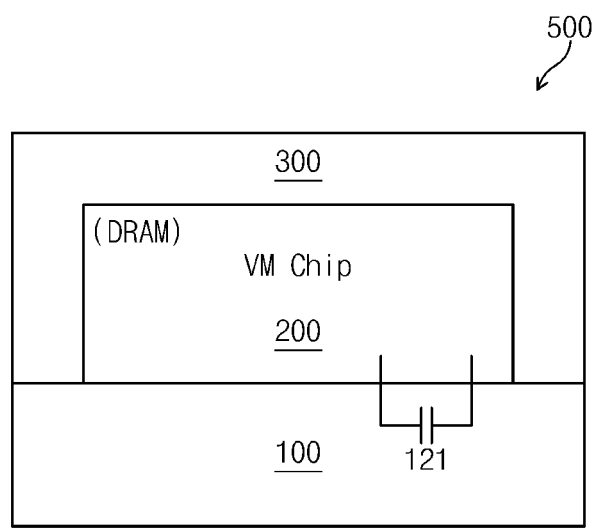
FIG. 9 is a cross sectional view illustrating a package structure of volatile memory device according to an embodiment of the present general inventive concept.
Figure 10:
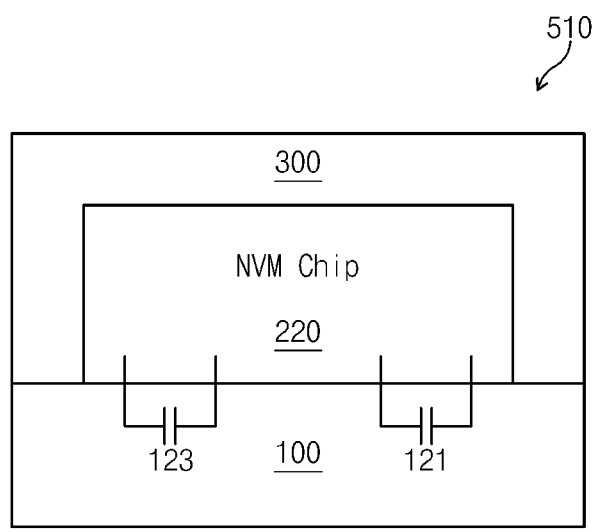
FIG. 10 is a cross sectional view illustrating a package structure of nonvolatile memory device according to an embodiment of the present general inventive concept.

FIG. 9 is a cross sectional view illustrating a package structure of a volatile memory device to which the present inventive concept is applied. FIG. 10 is a cross sectional view illustrating a package structure of a nonvolatile memory device to which the present inventive concept is applied.

Referring to FIG. 9, a volatile memory chip package 500 includes a mounting substrate 100, a volatile memory chip 200 such as a DRAM and a protective layer 300.

The decoupling capacitor 121 formed on the mounting substrate 100 effectively eliminates or reduces power noise of the voltage generation circuit located inside the volatile memory chip 200. As a result, operation reliability of the volatile memory chip 200 may be improved.

The volatile memory chip package 500 may be a package such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), and wafer-level processed stack package (WSP).

Referring to FIG. 10, a nonvolatile memory chip package 510 includes a mounting substrate 100, a nonvolatile memory chip 220 and a protective layer 300.

The decoupling capacitors 121 and 123 formed on the mounting substrate 100 effectively eliminate or reduce a power noise of the voltage generation circuit located inside the volatile memory chip 220. As a result, operation reliability of the volatile memory chip 220 may be improved.

The nonvolatile memory may be an EEPROM, a flash memory, a MRAM, a spin transfer torque MRAM, a conductive bridging RAM, a FeRAM, a PRAM called an OUM, a resistive RAM, a nanotube PRAM, a polymer RAM, a nano floating gate memory, a holographic memory, a molecular electronics memory device, or an insulator resistance change memory.

In this manner, when a decoupling capacitor is connected to the outside of the integrated circuit chip, the integrated circuit chip may efficiently cope with a power noise and a voltage drop.

Figure 11:
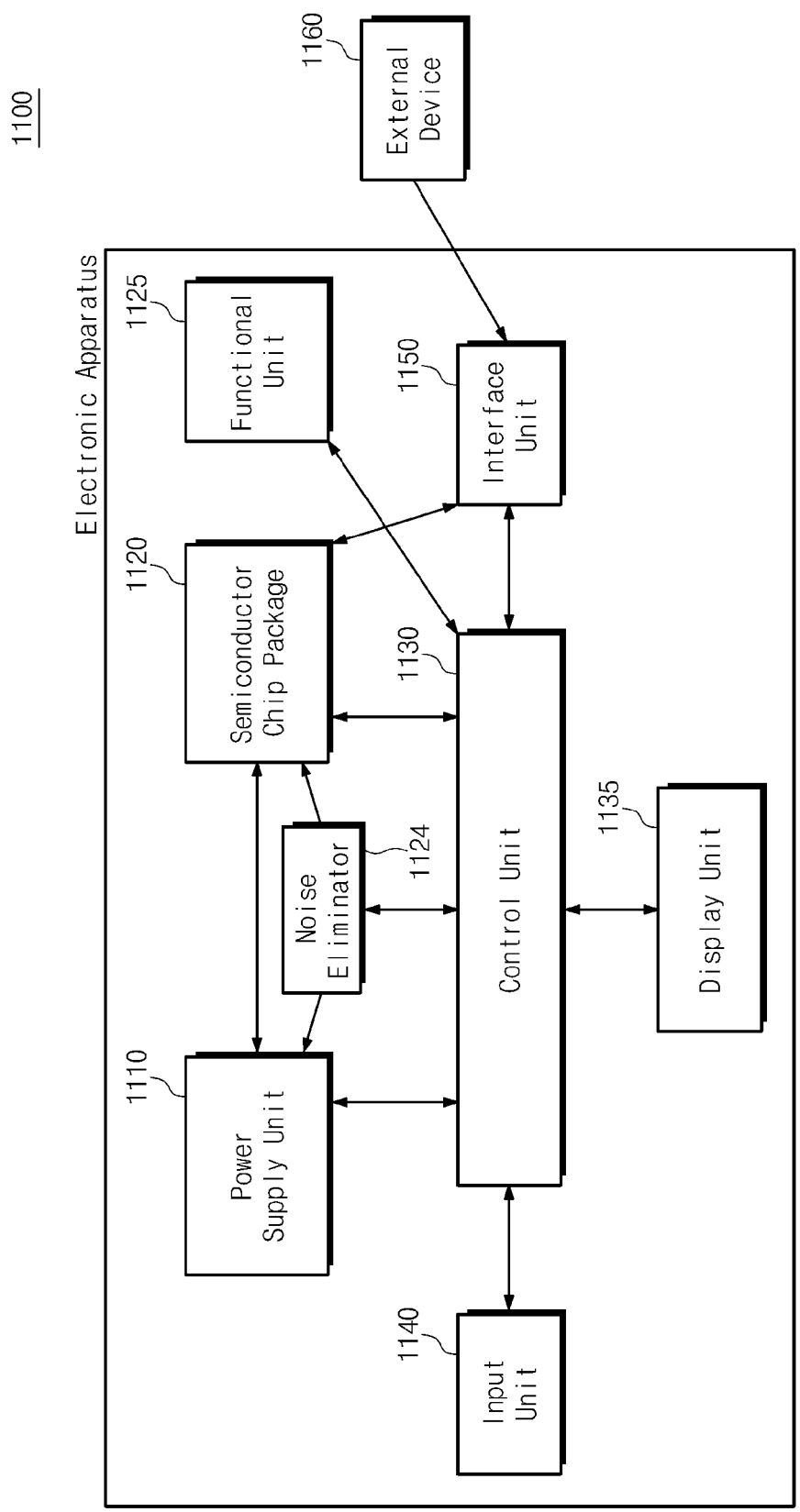
FIG. 11 is a circuit diagram illustrating an electronic apparatus according to an embodiment of the present general inventive concept.

FIG. 11 is a circuit diagram illustrating an electronic apparatus 1100 according to an embodiment of the present inventive concept.

The electronic apparatus 1100 may include, but is not limited to, a computing system, a cell phone, a laptop/desktop computer, or any other device or the like capable of receiving audio and/or video image data from an external device that stores and displays audio and/or video image data.

Referring to FIG. 11, the electronic apparatus 1100 includes a power supply unit 1110, a semiconductor chip package 1120, a functional unit 1125, a control unit 1130, a display unit 1135, an input unit 1140, an interface unit 1150 that receives audio and video data from an external device 1160 located outside of the electronic apparatus 1100 through wired or wireless communications.

The semiconductor chip package 1120 receives an external voltage through the power supply unit 1110 to generate a supply voltage to be used in the semiconductor chip package 1120. The semiconductor chip package 1120 may be a semiconductor chip package illustrated in FIGS. 1-10. The semiconductor chip package 1120 may have a memory unit to store data, and the electronic apparatus may store the data in the semiconductor chip package 1120 or read the data from the semiconductor chip package 1120 such that the data can be processed to perform a function of the electronic apparatus 1100.

A noise eliminator 1124 is connected to the power supply unit 1110 to reduce a power noise of the external voltage, and also connected to the semiconductor chip package 1120 to reduce a power noise of the internal voltage. The noise eliminator 1124 is formed outside of the semiconductor circuit package 1120 to eliminate or minimize the power noise from the external voltage and supply voltage with greater efficiency than a noise eliminator formed inside of the semiconductor chip package 1120. The noise eliminator 1124 may allow the input unit 1140 of the electronic apparatus 1100 to input a user command with a reduced level of distortion and interference and the interface unit 1150 to receive an audio and video image data from an external device 1160 with a reduced level of distortion and interference.

The interface unit 1150 receives the supply voltage that is generated by the semiconductor chip package 1120 with a reduced level of power noise and also receives an audio and/or a video image data from an external device 1160 such as a mobile phone, a desktop computer, or a television apparatus, etc. Further, the interface unit 1150 transmits the received audio and/or video image data to the control unit 1130. The control unit 1130 can also receive a user command that is input by a user of the electronic apparatus 1100 through the input unit 1140 and/or receive data from a memory of the semiconductor chip package 1120 to perform a function of the electronic apparatus 1100. The input unit 1140 can be represented by, but is not limited to, a keypad on a computer or mobile phone, or a plurality of channel numbers on a television display or a television remote control, etc. The input unit 1140 and the display unit 1135 may be formed as a single unit, for example, a touch panel to display an image and to input a user command or a user input data.

The functional unit 1125 may function as a processing unit to process data associated with the semiconductor chip package 1120 and/or process the audio and/or video image data in the control unit 1130 to allow the control unit 1130 to transmit the audio and/or video image data to the display unit 1135. The functional unit may be installed in the semiconductor chip package 1120 to perform a function thereof.

The control unit 1130 may transmit the audio and/or video image data processed by the functional unit 1125 to the display unit 1135 to allow the display unit 1135 to display the audio and video image data of the electronic apparatus 1100 with the reduced level of distortion and interference.

In the exemplary embodiment described in FIG. 11, the power noise generated from the external voltage and supply voltage is efficiently eliminated or minimized by the noise eliminator 1124 located outside of the semiconductor chip package 1120. Accordingly, the display unit 1135 can display the audio and video image data received from the external device 1160 with the reduced level of distortion and interference.

According to embodiments of the inventive concept, power noise generated from a voltage generation circuit in an integrated circuit chip is effectively eliminated or minimized by a noise eliminator formed on a mounting substrate. In the event that the present inventive concept is applied to an internal voltage converter of a semiconductor memory device such as a DRAM, an internal circuit may receive a more reliable internal voltage. Thus, reliability with respect to data access operation of semiconductor memory device may be improved.

The above-disclosed subject matter is to be considered illustrative, and not restrictive, and the appended claims are intended to cover all such modifications, enhancements, and other embodiments, which fall within the true spirit and scope of the inventive concept. Although a few features and utilities of the present general inventive concept have been shown and described, it will be appreciated by those skilled in the art that changes may be made in these embodiments without departing from the principles and spirit of the present general inventive concept, the scope of which is defined in the appended claims and their equivalents.

What is claimed is:

1. A semiconductor chip package comprising:
    an integrated circuit chip including a voltage generation circuit that receives an external voltage to generate a supply voltage greater than the external voltage to be used in an internal circuit and a connection terminal connected to an output node of the voltage generation circuit; and
    a mounting substrate including a noise eliminator electrically connected to the connection terminal to reduce a power noise of the supply voltage and to mount the integrated circuit chip to package the integrated circuit chip as the semiconductor chip package.

2. The semiconductor chip package of claim 1, wherein the internal circuit comprises a peripheral circuit or a cell array, and
    the voltage generation circuit is an internal voltage converter that generates the supply voltage for the peripheral circuit or the cell array.

3. The semiconductor chip package of claim 1, wherein the noise eliminator is a decoupling device to eliminate the power noise.

4. The semiconductor chip package of claim 3, wherein the decoupling device is a decoupling capacitor formed on an upper portion of the mounting substrate.

5. The semiconductor chip package of claim 3, wherein the decoupling device is a decoupling capacitor formed inside the mounting substrate.

6. The semiconductor chip package of claim 3, wherein the decoupling device is a decoupling capacitor formed on a lower portion of the mounting substrate.

7. The semiconductor chip package of claim 4, wherein the decoupling capacitor is connected to the connection terminal by using a wire bonding.

8. The semiconductor chip package of claim 4, wherein the decoupling capacitor is connected to the connection terminal by using a flip chip bonding.

9. The semiconductor chip package of claim 3, wherein the decoupling device is mounted by using a SMT mounting method or an embedded mounting method.

10. The semiconductor chip package of claim 3, wherein the decoupling device is a film type capacitor or a silicon capacitor.

11. A semiconductor chip package comprising:
    an integrated circuit chip including an external voltage supply circuit that receives an external voltage to distribute it;
    a back bias voltage generation circuit that receives the external voltage distributed by the external voltage supply circuit to generate a back bias supply voltage to be used in an internal circuit;
    a first connection terminal connected to an input node of the external voltage supply circuit and a second connection terminal connected to an output terminal of the back bias supply voltage of the voltage generation circuit; and
    a mounting substrate including a first noise eliminator and a second noise eliminator independently connected to the first and second connection terminals, respectively, to reduce a power noise of the external voltage and a power noise of the back bias supply voltage and to mount the integrated circuit chip to package the integrated circuit chip as the semiconductor chip package.

12. The semiconductor chip package of claim 11, wherein the internal circuit comprises a peripheral circuit of a semiconductor memory or a memory cell array, and
    the back bias voltage generation circuit generates the back bias supply voltage for the peripheral circuit of semiconductor memory or the memory cell array.

13. The semiconductor chip package of claim 11, wherein the first noise eliminator is a first decoupling capacitor and the second noise eliminator is a second decoupling capacitor formed inside or outside the mounting substrate.

14. An electronic apparatus comprising:
    an interface unit to receive an external voltage from an external source;
    a semiconductor chip package including:
        an integrated circuit chip including a voltage generation circuit that receives the external voltage from the external source to generate a supply voltage to be used in an internal circuit and a connection terminal connected to an output node of the voltage generation circuit, and
        a mounting substrate including a noise eliminator electrically connected to the connection terminal to reduce a power noise of the supply voltage and to mount the integrated circuit chip to package the integrated circuit chip as the semiconductor chip package; and
    a control unit to control the semiconductor chip package to process a function of the electronic apparatus to be associated with data of the semiconductor chip package.

15. The electronic apparatus of claim 14, wherein the noise eliminator is formed outside of the integrated circuit chip and also reduces a power noise of the external voltage supplied from the external source.

16. The electronic apparatus of claim 15, wherein the control unit controls an input unit to transmit a user command, and the interface unit to receive an audio and video image data from an external device.

17. The electronic apparatus of claim 16, wherein the noise eliminator allows the input unit to input the user command with a reduced level of distortion and interference and the interface unit to receive the audio and video image data with a reduced level of distortion and interference from the external device.

18. The electronic apparatus of 17, further comprising:
    a functional unit to process the user command and the audio and video image data and the control unit controls a display unit to display the audio and video image data with the reduced level of distortion and interference.

* * * * *